United States Patent [19]
Jeong

[11] Patent Number: 5,571,742
[45] Date of Patent: Nov. 5, 1996

[54] METHOD OF FABRICATING STACKED CAPACITOR OF DRAM CELL

[75] Inventor: Jae Goan Jeong, Kyoungki-do, Rep. of Korea

[73] Assignee: Hyundai Electronics Industries Co., Ltd., Kyoungki-do, Rep. of Korea

[21] Appl. No.: 227,737

[22] Filed: Apr. 14, 1994

[30] Foreign Application Priority Data

Apr. 14, 1993 [KR] Rep. of Korea .................. 1993-6203

[51] Int. Cl.⁶ .............................. H01L 21/70; H01L 27/00
[52] U.S. Cl. .................. 437/52; 437/60; 437/919
[58] Field of Search .................... 437/47, 52, 60, 437/919; 43/48; 148/Dig. 14; 257/303, 306–308

[56] References Cited

U.S. PATENT DOCUMENTS

| | | | |
|---|---|---|---|
| 5,049,957 | 9/1991 | Inoue et al. | 437/52 |
| 5,053,351 | 10/1991 | Fazan et al. | 437/52 |
| 5,164,337 | 11/1992 | Ogawa et al. | 437/52 |

Primary Examiner—H. Jey Tsai
Attorney, Agent, or Firm—Popham, Haik, Schnobrich & Kaufman, Ltd.

[57] ABSTRACT

A stack capacitor capable of obtaining high capacitance in a limited area, thereby improving the integration degree of a semiconductor memory device and a process for fabricating the same. The process includes the steps of preparing a semiconductor substrate formed with a metal oxide semiconductor transistor, forming an insulating film over the transistor, forming a conductive material layer for a lower electrode plate on the insulating film such that the conductive material layer is electrically connected to the transistor, forming at least one conductive material layer for at least one additional electrode plate on the conductive material layer for the lower electrode plate such that it is spaced a predetermined distance apart from the conductive material layer for the lower electrode plate, forming at least one vertical column adapted to electrically connect the at least one additional electrode plate to the lower electrode plate, and sequentially coating a dielectric film and a plate electrode over the entire exposed surface of the resulting structure including the entire exposed surface of the additional electrode plate and the entire exposed surface of the at least one vertical column.

8 Claims, 18 Drawing Sheets

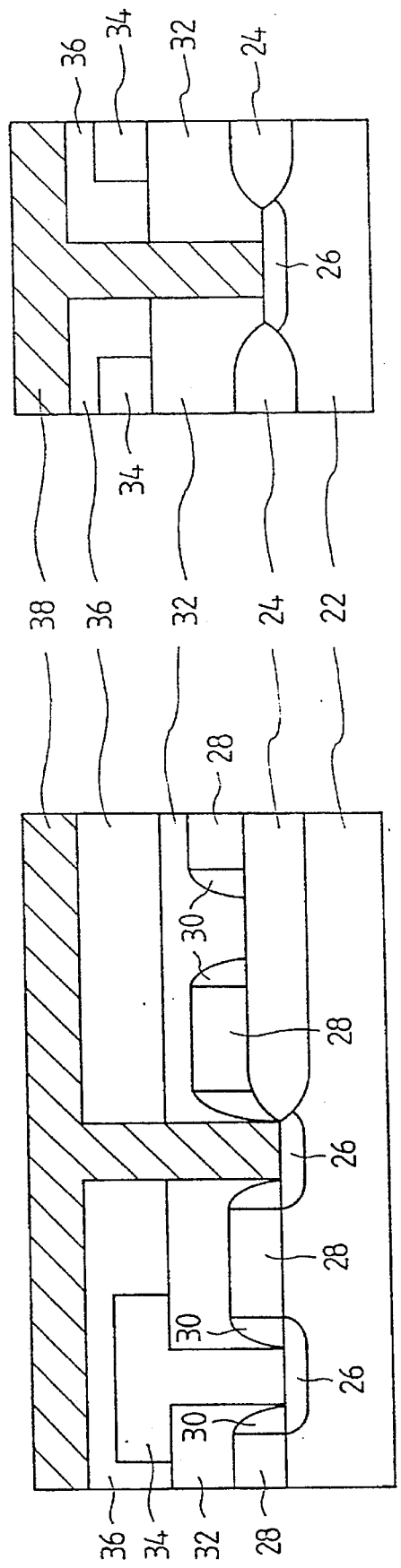

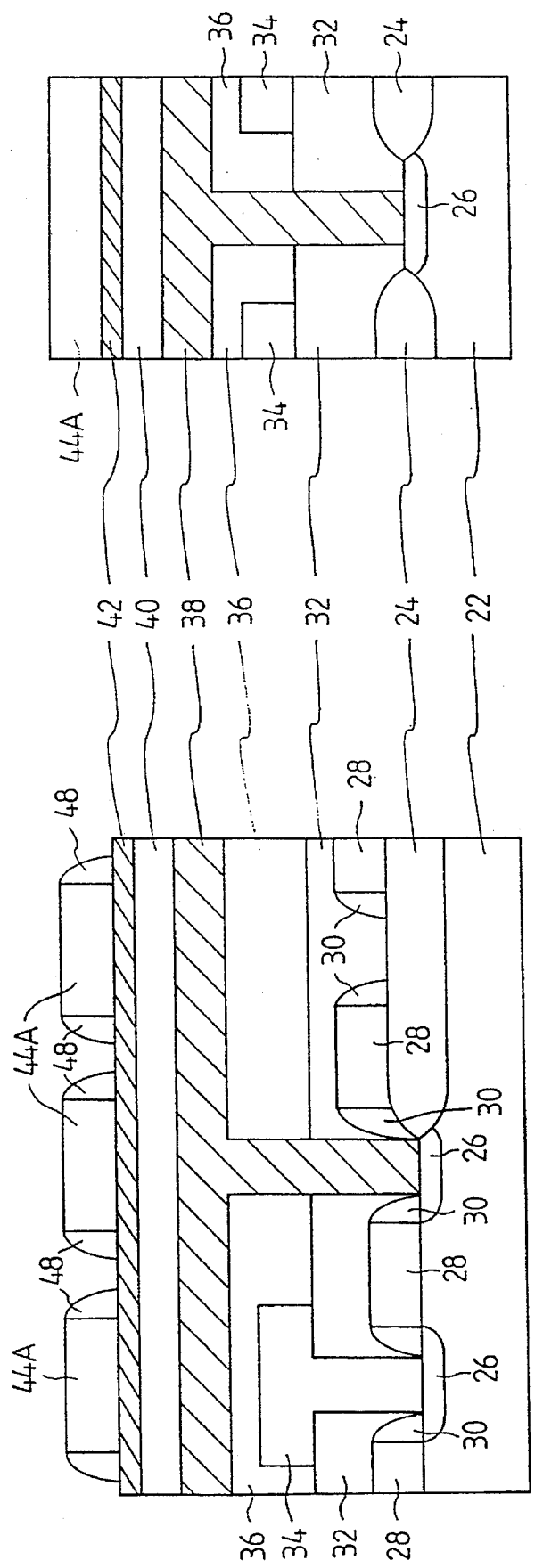

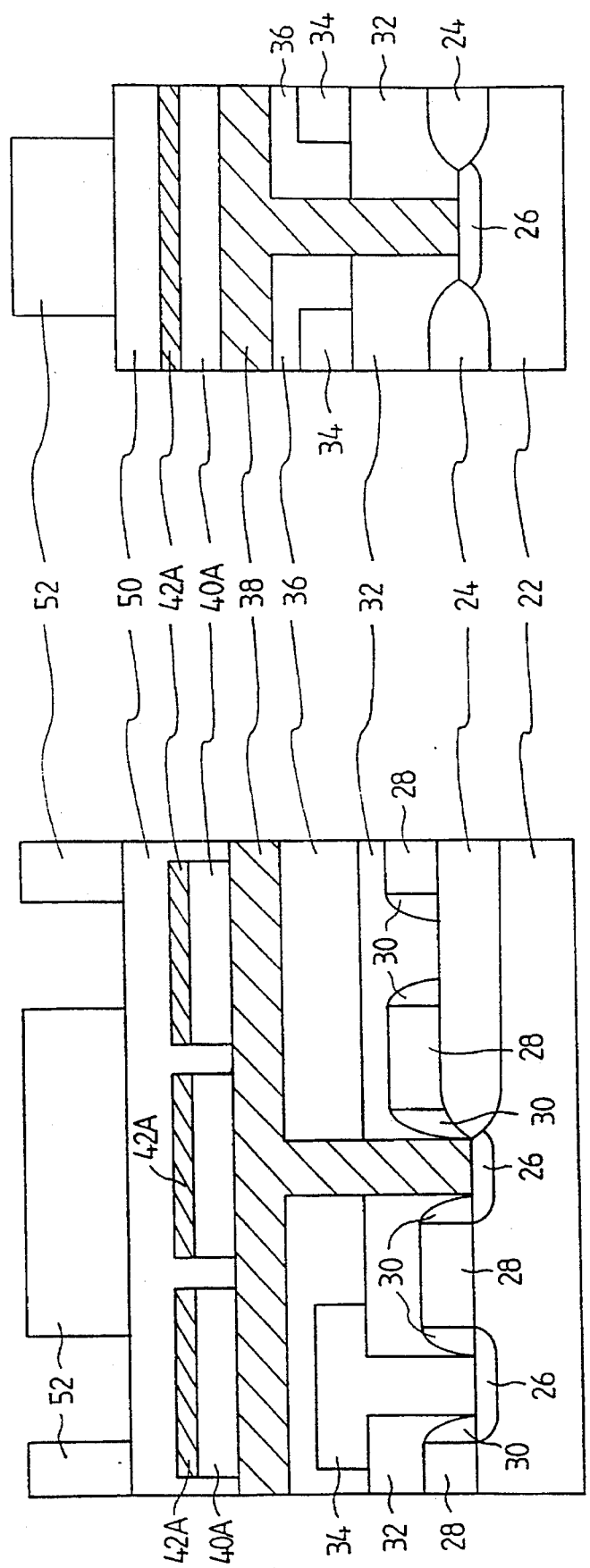

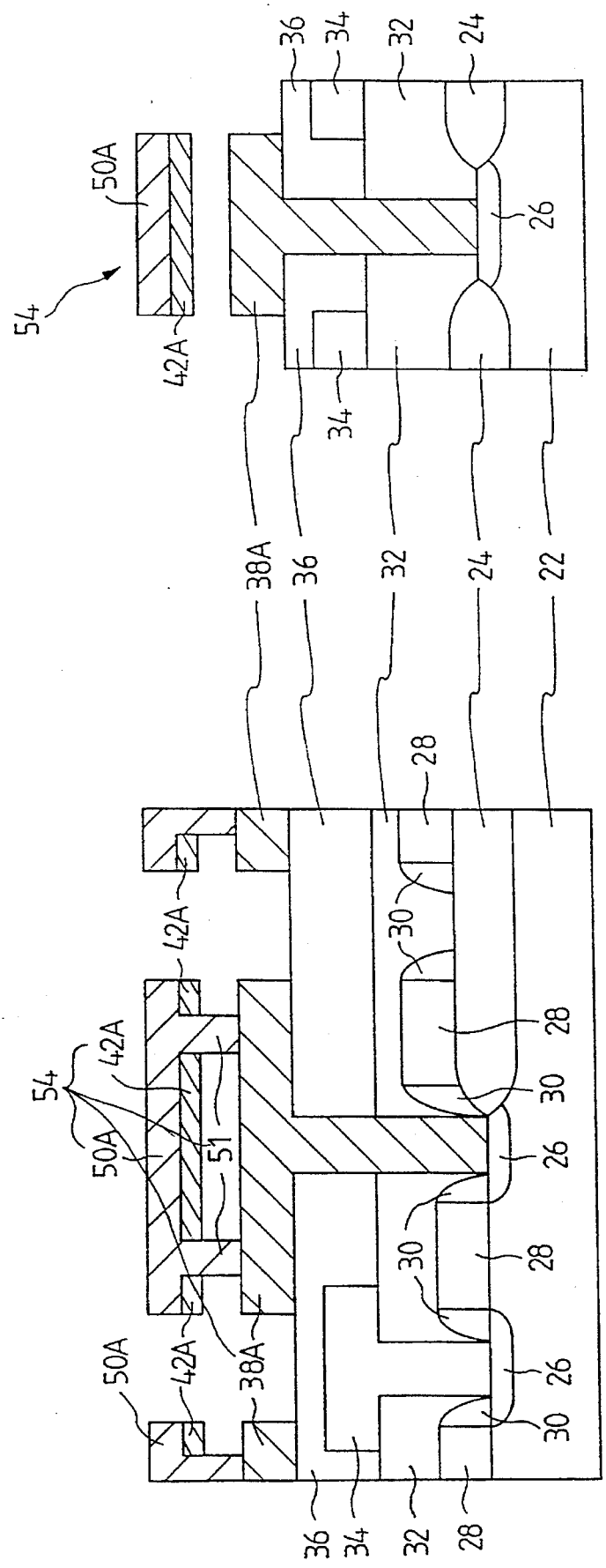

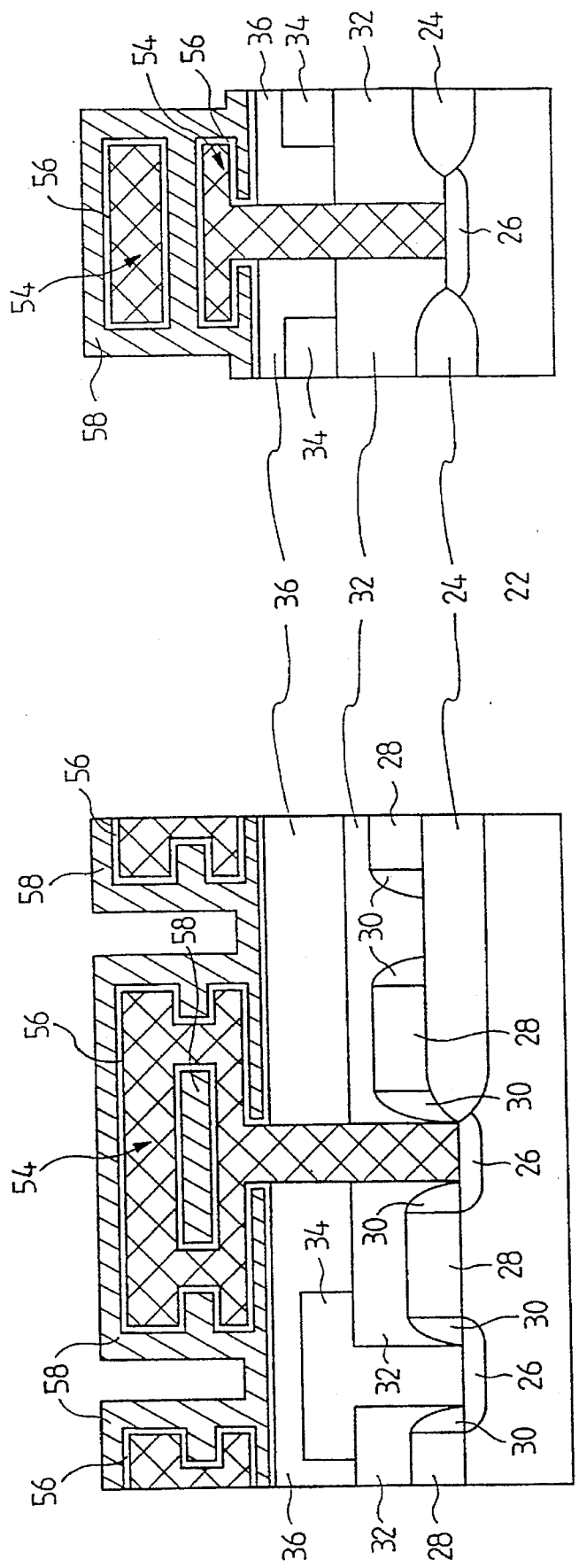

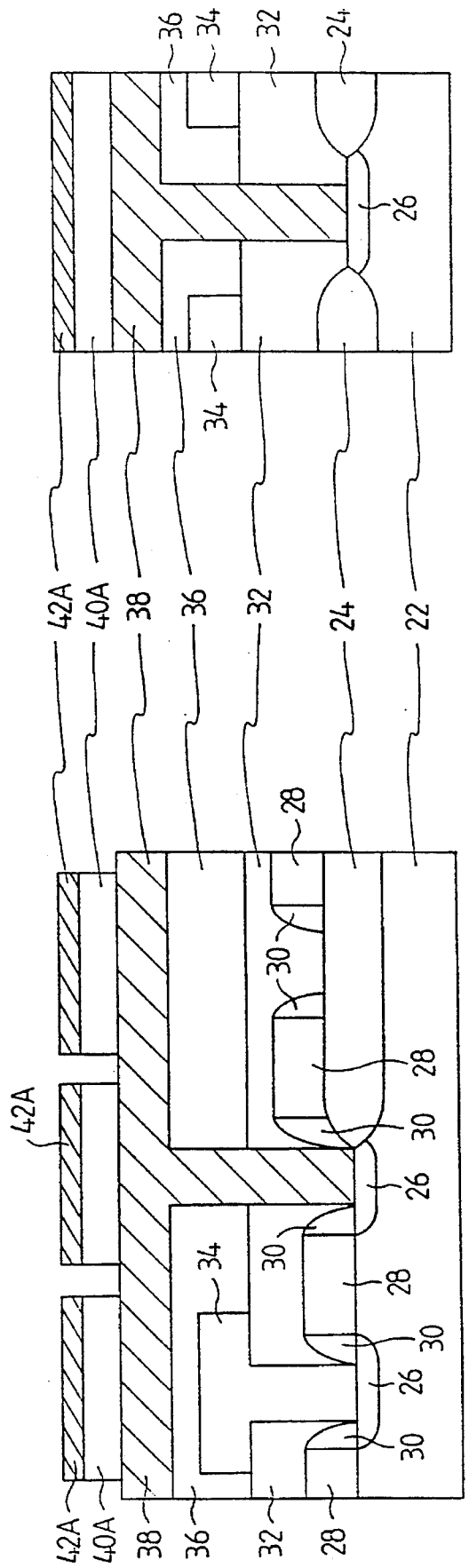

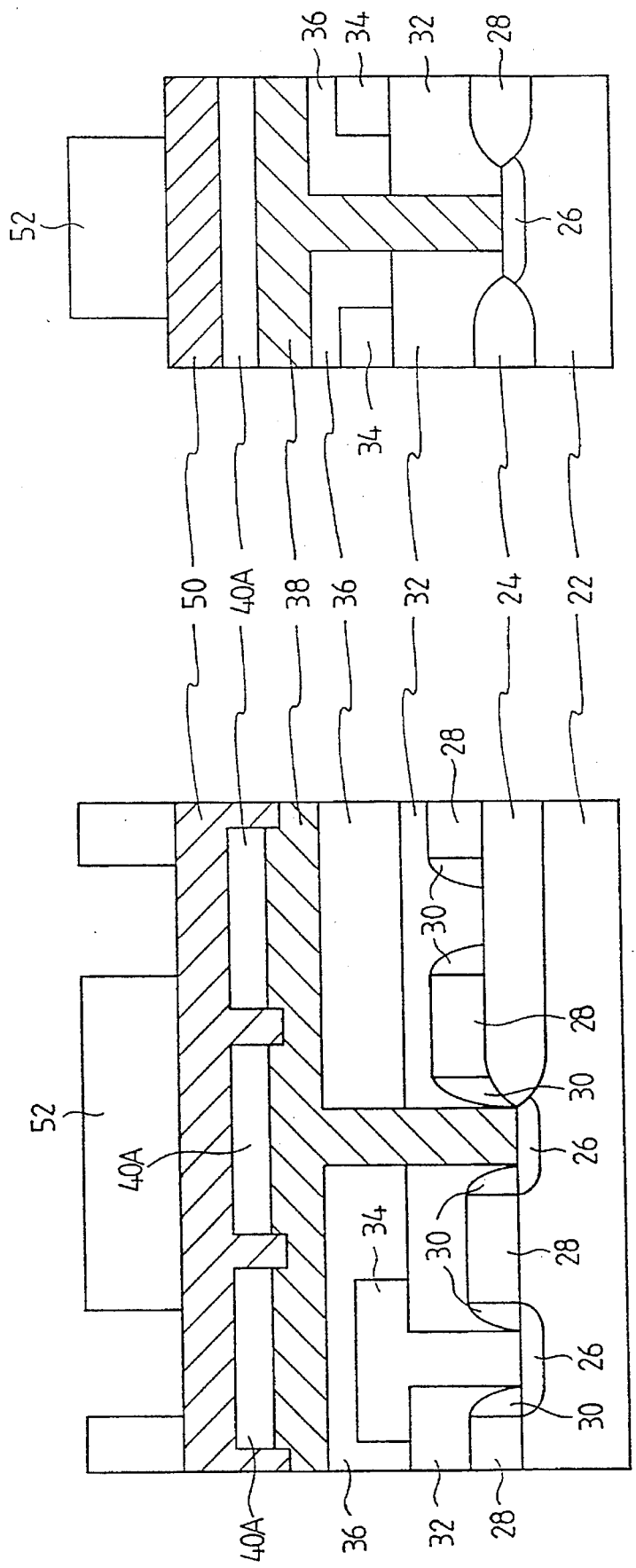

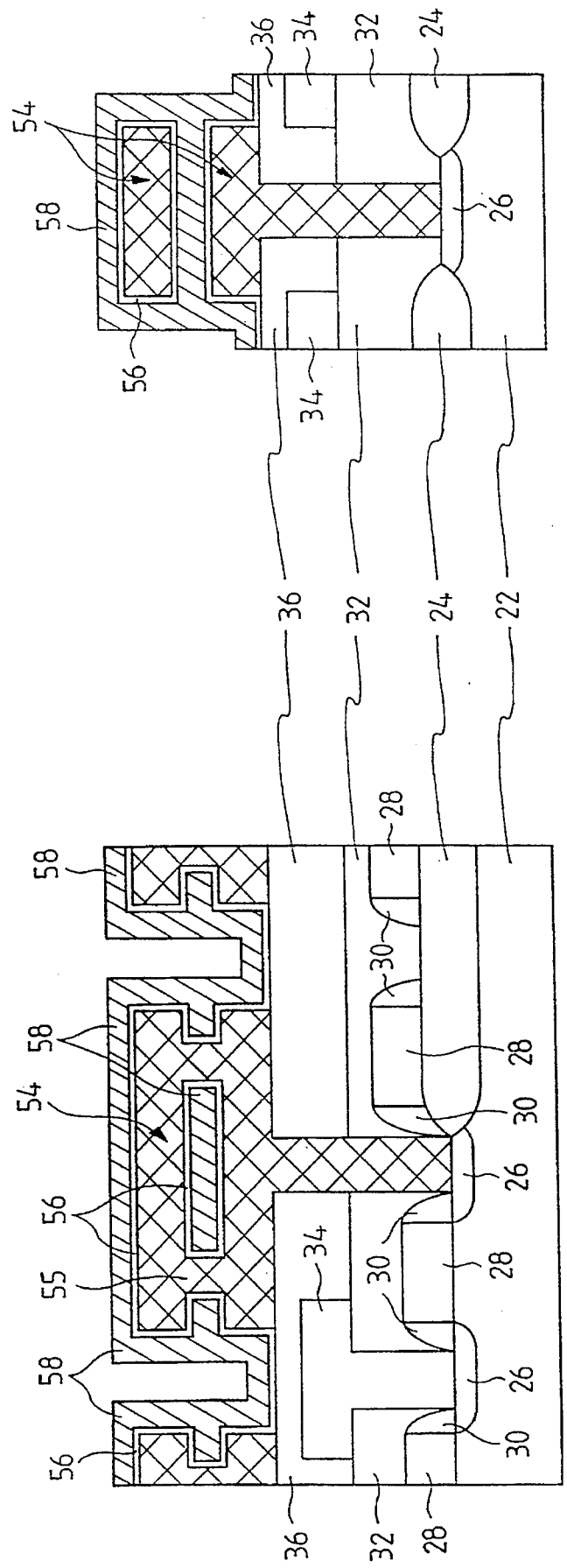

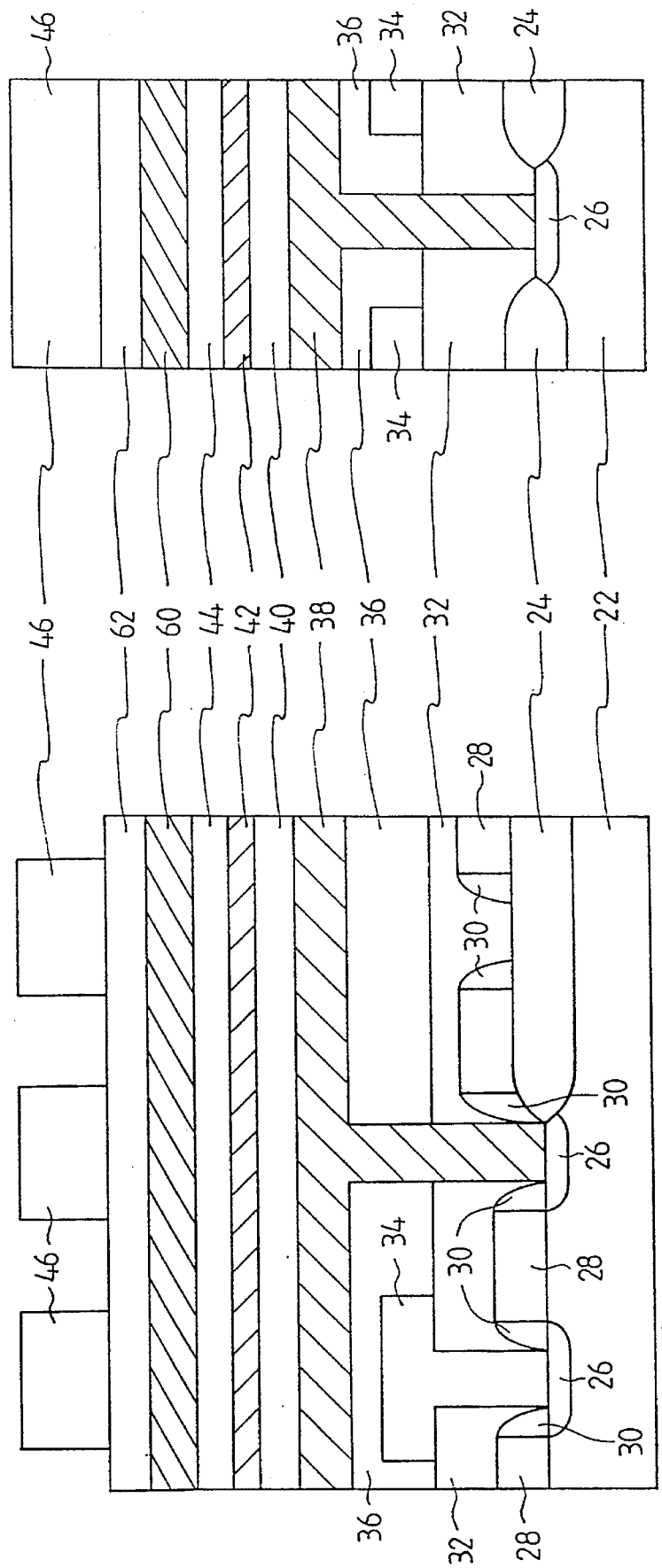

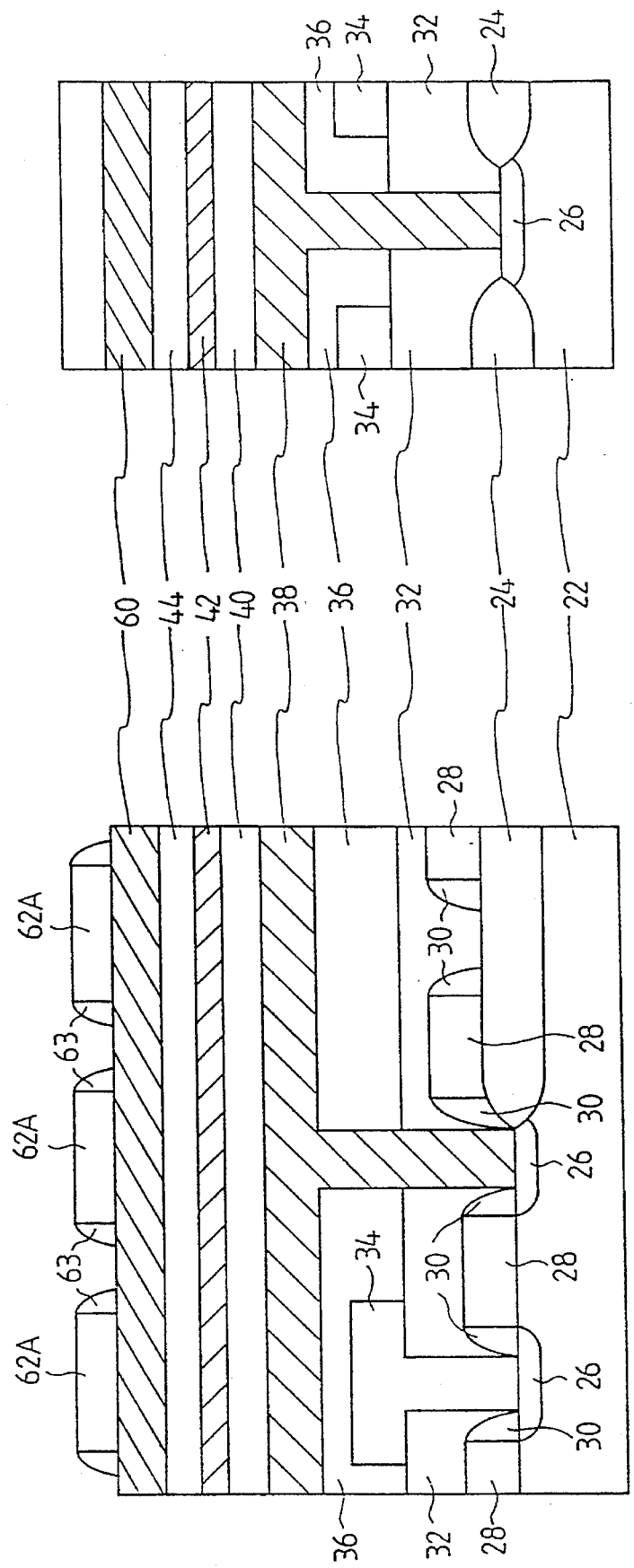

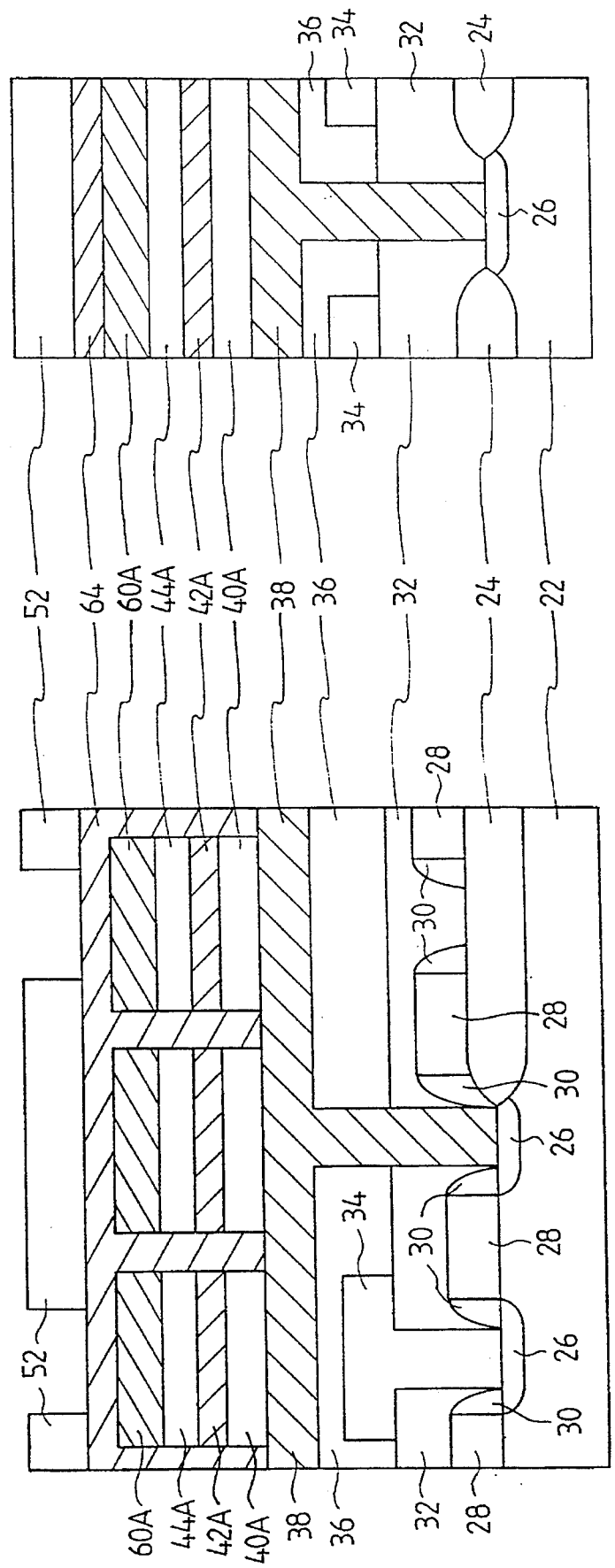

METHOD OF FABRICATING STACKED CAPACITOR OF DRAM CELL

BACKGROUND OF THE INVENTION

1. Field of the Invention

The present invention relates to a stack capacitor constituting a part of a memory cell of a highly integrated semiconductor memory device, and more particularly to such a stack capacitor capable of obtaining high capacitance in a limited area, thereby improving the integration degree of a semiconductor memory device finally produced and a process for fabricating the same.

2. Description of the Prior Art

Typically, general semiconductor memory devices such as dynamic random access memories (DRAMs) have a highly integrated structure so as to store as much information as possible. Due to such a highly integrated structure, each memory cell has a limited unit area. As a result, a stack capacitor, constituting the memory cell together with a transistor, occupies a very limited area so as to have insufficient capacitance. Consequently, the integration degree of semiconductor memory devices should be limited to a certain level.

SUMMARY OF THE INVENTION

Therefore, an object of the invention is to provide a stack capacitor capable of obtaining high capacitance in a limited area, thereby improving the integration degree of a semiconductor memory device and a process for fabricating the same.

In accordance with one aspect of the present invention, the present invention provides a semiconductor memory device having a semiconductor substrate formed with a metal oxide semiconductor transistor, comprising: a lower electrode plate electrically connected with said transistor; at least one additional electrode plate formed on said lower electrode such that it is spaced a predetermined distance apart from the lower electrode; at least one vertical column adapted to electrically connect said at least one additional electrode plate to the lower electrode plate; and a dielectric film and a plate electrode sequentially coated over the entire exposed surface of the resulting structure including the entire exposed surface of the additional electrode plate, an exposed surface of the lower electrode plate, and the entire exposed surface of said at least one vertical column.

In accordance with another aspect, the present invention provides a process for fabricating a stack capacitor of a dynamic random access memory device, comprising the steps of: preparing a semiconductor substrate formed with a metal oxide semiconductor transistor; forming an insulating film over said transistor; forming a conductive material layer for a lower electrode plate on said insulating film such that said conductive material layer is electrically connected to the transistor; forming at least one conductive material layer for at least one additional electrode plate on the conductive material layer for the lower electrode plate such that it is spaced a predetermined distance apart from the conductive material layer for the lower electrode plate; forming at least one vertical column adapted to electrically connect said at least one additional electrode plate to the lower electrode plate; and sequentially coating a dielectric film and a plate electrode over the entire exposed surface of the resulting structure including the entire exposed surface of the additional electrode plate and the entire exposed surface of said at least one vertical column.

BRIEF DESCRIPTION OF THE DRAWINGS

These and other objects, features and advantages of the invention will become more apparent upon a reading of the following detailed specification and drawings, in which:

FIGS. 2A to 2F are sectional views respectively taken along the line A–A' of FIG. 1, illustrating sequential steps of a process for fabricating a stack capacitor in accordance with a first embodiment of the present invention;

FIGS. 3A to 3F are sectional views respectively taken along the line B–B' of FIG. 1, illustrating sequential steps of the process for fabricating the stack capacitor in accordance with the first embodiment of the present invention;

FIGS. 4A to 4C are sectional views respectively taken along the line A–A' of FIG. 1, illustrating sequential steps of a process for fabricating a stack capacitor in accordance with a second embodiment of the present invention;

FIGS. 5A to 5C are sectional views respectively taken along the line B–B' of FIG. 1, illustrating sequential steps of the process for fabricating the stack capacitor in accordance with the second embodiment of the present invention;

FIGS. 6A to 6C are sectional views respectively taken along the line A–A' of FIG. 1, illustrating sequential steps of a process for fabricating a stack capacitor in accordance with a third embodiment of the present invention;

FIGS. 7A to 7C are sectional views respectively taken along the line B–B' of FIG. 1, illustrating sequential steps of the process for fabricating the stack capacitor in accordance with the third embodiment of the present invention;

FIGS. 8A to 8E are sectional views respectively taken along the line A–A' of FIG. 1, illustrating sequential steps of a process for fabricating a stack capacitor in accordance with a fourth embodiment of the present invention; and FIGS. 9A to 9E are sectional views respectively taken along the line B–B' of FIG. 1, illustrating sequential steps of the process for fabricating the stack capacitor in accordance with the fourth embodiment of the present invention.

DETAILED DESCRIPTION OF THE PREFERRED EMBODIMENTS

Figure 1:
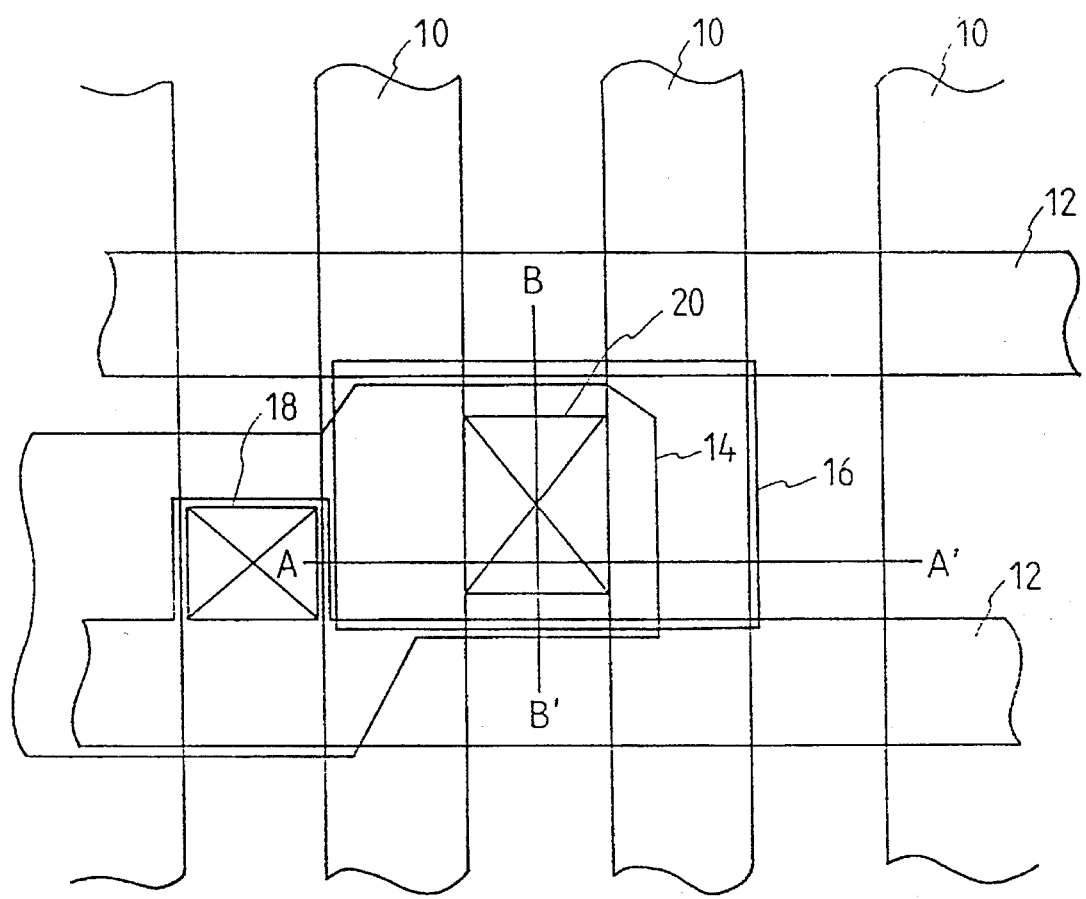
FIG. 1 a plan view illustrating a layout of a DRAM to which the present invention is applied.

FIG. 1 illustrates a layout of a DRAM to which the present invention is applied. As shown in FIG. 1, the DRAM includes a plurality of word lines 10 horizontally arranged in parallel to one another and a plurality of bit lines 12 vertically arranged in parallel to one another. The DRAM further includes an active region 16 overlapped with each bit line 12, and a storage electrode 16 arranged between neighboring bit lines 12. Each storage electrode 16 is electrically connected to each corresponding active region 14 by a contact 20 for the storage electrode. On the other hand, each bit line 12 is electrically connected to each corresponding active region 14 by a bit line contact 18.

FIGS. 2A to 2F are sectional views respectively taken along the line A–A' of FIG. 1, illustrating sequential steps of a process for fabricating a stack capacitor in accordance with a first embodiment of the present invention. On the other hand, FIGS. 3A to 3F are sectional views respectively taken along the line B–B' of FIG. 1, illustrating sequential steps of the process for fabricating the stack capacitor in accordance with the first embodiment of the present invention.

In accordance with the process of the first embodiment of the present invention, a silicon substrate 22 is first prepared, on which impurity-diffused regions 26 are formed respectively at active regions 14 isolated from one another by an element-isolating oxide film 24, as shown in FIGS. 2A and 3A. A word line 28 is formed on the silicon substrate 22 between neighboring impurity-diffused regions 26. Over the entire exposed surface of the resulting structure, a first insulating layer 32 is coated to have a planarized surface. On the first insulating layer 32, a bit line 34 is formed which is electrically connected to each impurity-diffused region 26 for drain. Thereafter, a planarized second insulating layer 36 and a first polysilicon layer 38 are sequentially formed over the resulting structure including the bit lines 34 and the first insulating layer 32. The first polysilicon layer 38 formed over the second insulating layer 36 is electrically connected with each impurity-diffused region for source.

Figures 2B, 3B:
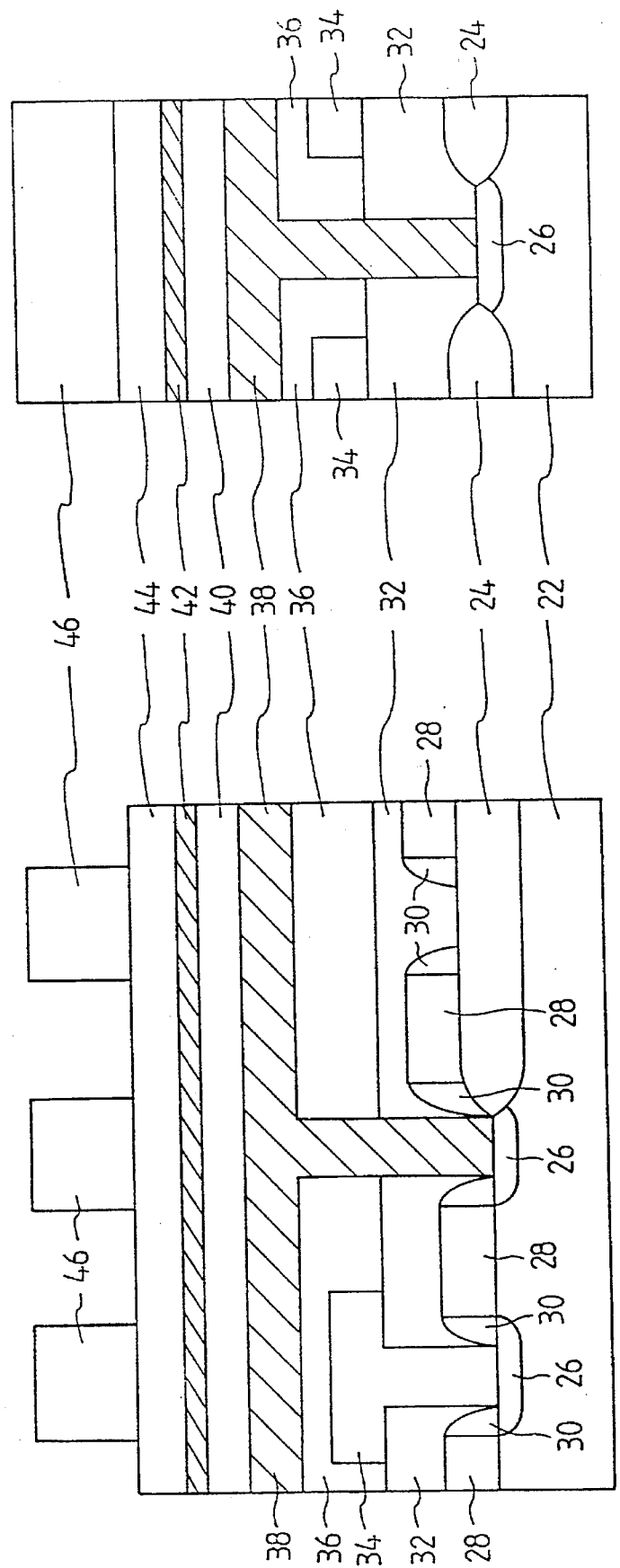

Subsequently, a first oxide film 40 and a second polysilicon layer 42 are sequentially deposited over the first polysilicon layer 38, as shown in FIGS. 2B and 3B. The first oxide film 40 has a thickness of 1,000 to 2,500 Å whereas the second polysilicon layer 42 has a thickness of 500 to 1,500 Å. Thereafter, a second oxide film 44 is formed over the second polysilicon layer 42. A first photoresist pattern 46 is then formed on the second oxide film 44. The second oxide film 44 has a thickness of 1,000 to 3,000 Å. The first photoresist pattern 46 has a polarity opposite to that of a mask for forming the word lines 38.

The second oxide film 44 is then partially dry-etched at its portions exposed through the first photoresist pattern 46 shown in FIG. 2B, thereby forming a second oxide film pattern 44A. After the formation of the second oxide film pattern 44A, the first photoresist pattern 46 is removed. Subsequently, second spacers 48 made of an oxide are formed at side walls of the second oxide film pattern 44A. The facing second spacers 48 are spaced a distance of about 1,000 Å apart from each other.

Thereafter, the second polysilicon layer 42 and the first oxide film 40 are selectively removed, thereby forming a second polysilicon layer pattern 42A and the first oxide film pattern 40A, as shown in FIGS. 2D and 3D. The formation of the second polysilicon layer pattern 42A is achieved by etching portions of the second polysilicon layer 42 exposed through the second spacers 48 and the second oxide film pattern 44A. The formation of the first oxide film pattern 40A is achieved by etching portions of the first oxide film 40 exposed through the second polysilicon layer pattern 42A. Through the first oxide film pattern 40A, the first polysilicon layer 38 is partially exposed. Upon etching the first oxide film 40, the second spacers 48 and the second oxide film pattern 44A disposed over the second polysilicon layer pattern 42A are removed. Over the entire exposed surface of the resulting structure, a third polysilicon layer 50 and a second photoresist pattern 52 for a storage electrode mask are then sequentially formed. The formation of the third polysilicon layer 50 is achieved by depositing polysilicon to a thickness of 500 to 1,500 Å over the second polysilicon layer pattern 42A and the exposed portions of the first polysilicon layer 38.

Using the second photoresist pattern 52 as a mask, the third polysilicon layer 50, the second polysilicon layer pattern 42A and the first polysilicon layer 38 are selectively dry etched, thereby forming storage electrodes 54, as shown in FIGS. 2E and 3E. After the formation of storage electrodes 54, the second photoresist pattern 52 is completely removed. Thereafter, the first oxide film pattern 40A is completely removed by wet etching.

Each storage electrode 54 has a structure including a lower storage electrode portion comprised of the first polysilicon layer pattern 38A, an upper storage electrode portion comprised of the second polysilicon layer pattern 42A and the third polysilicon layer pattern 50A, and vertical columns 51 for electrically connecting the lower and upper electrode portions with each other. The vertical columns 51 are comprised of the third polysilicon layer 50 and integral with the lower and upper storage electrode portions. Neighboring storage electrodes 54 are spaced a predetermined distance apart from each other.

Figures 2F, 3F:
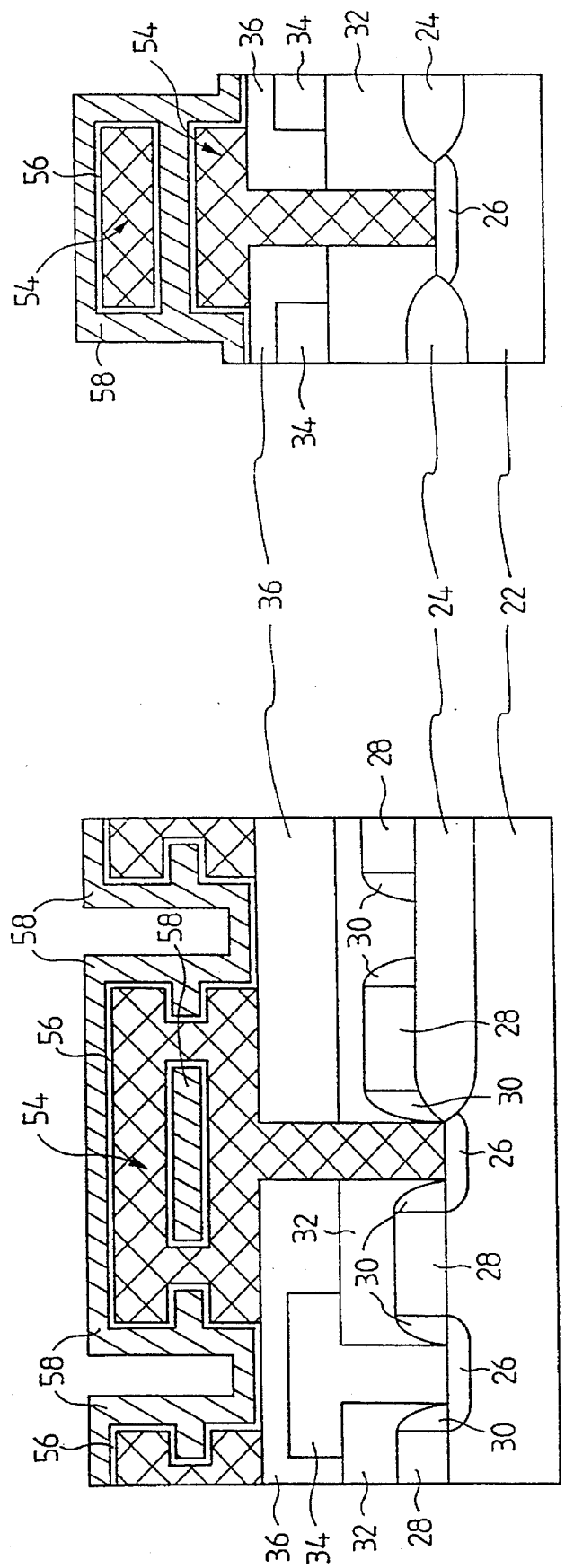

A dielectric film 56 is then formed over the entire exposed surface of the resulting structure including the storage electrodes 54, as shown in FIGS. 2F and 3F. Subsequently, a plate electrode 58 comprised of a polysilicon layer is formed over the dielectric film 56. The dielectric film 56 and the plate electrode 58 are disposed over the upper and side surfaces of the first polysilicon layer pattern 38A, the lower and side surfaces of the second polysilicon layer pattern 42A and the upper and side surfaces of the third polysilicon layer pattern 50A. Thus, a stack capacitor is fabricated.

In the stack capacitor obtained in accordance with the process illustrated in FIGS. 2A to 2F and FIGS. 3A to 3F, the surface area of storage electrodes is increased in that the storage electrodes have a double plate structure. By virtue of the double plate structure of storage electrodes, the stack capacitor has an increased capacitance in spite of its small occupied area.

Figures 4A, 5A:
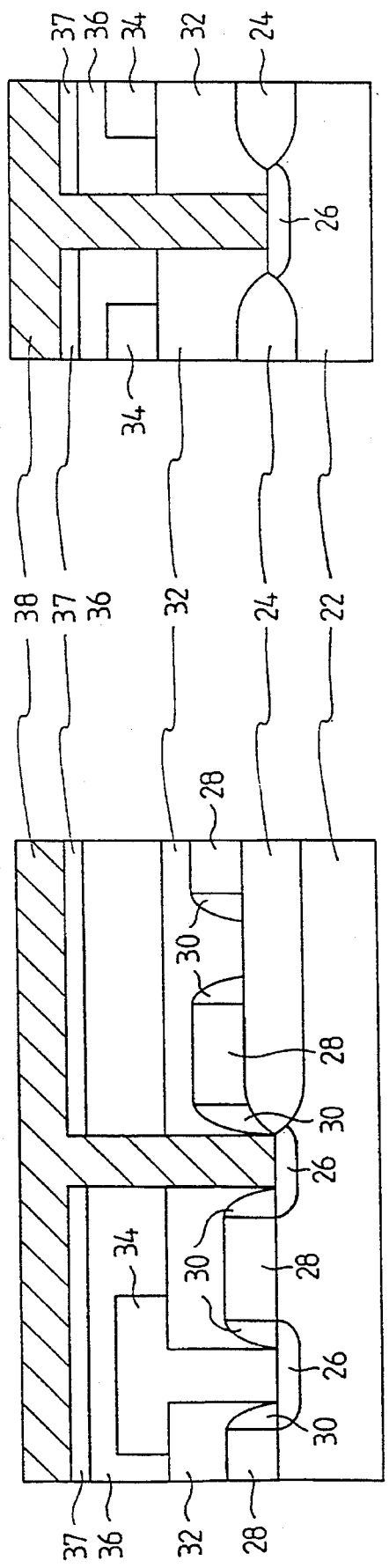
Figures 4B, 5B:
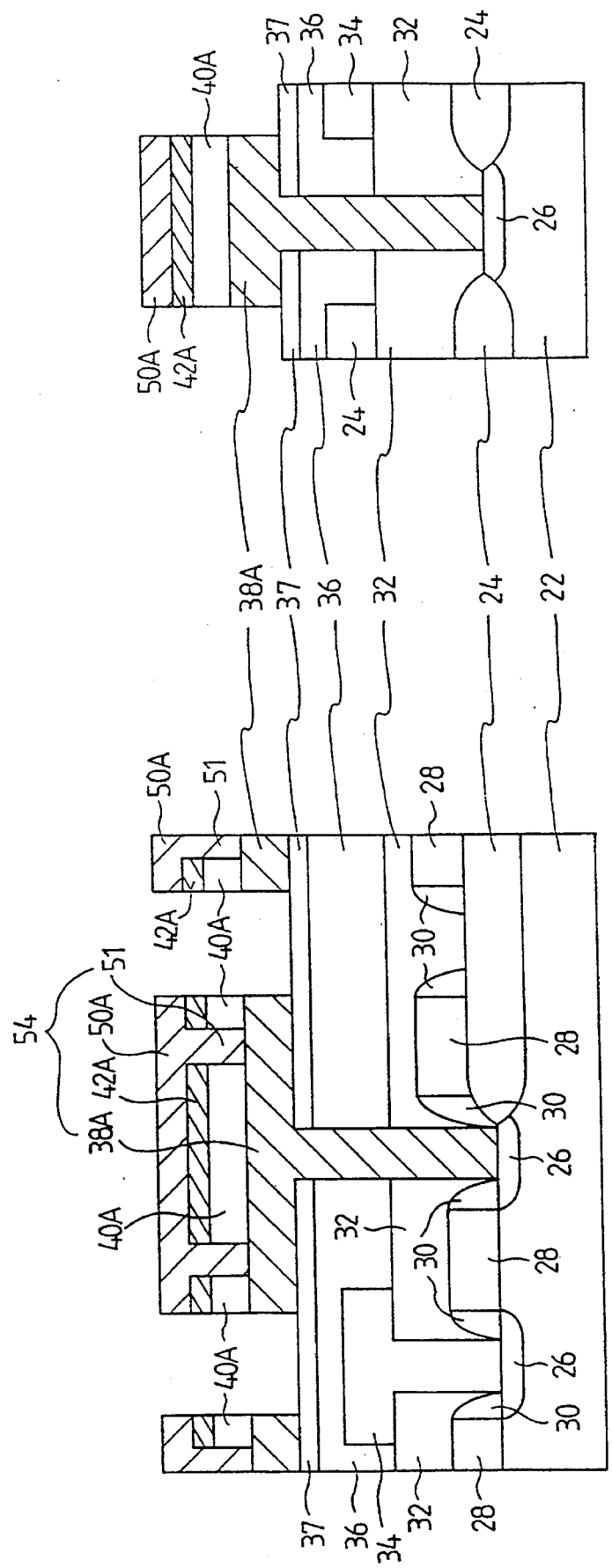

FIGS. 4A to 4C are sectional views respectively taken along the line A—A' of FIG. 1. On the other hand, FIGS. 5A to 5C are sectional views respectively taken along the line B—B' of FIG. 1. FIGS. 4A to 4C and FIGS. 5A to 5C illustrate respectively the sequential steps of a process for fabricating a stack capacitor in accordance with a second embodiment of the present invention. In accordance with this process, it is possible to fabricate a stack capacitor having a larger surface area than that of the stack capacitor including the double plate-type storage electrode in accordance with the above-mentioned process. In FIGS. 4A to 5C, elements corresponding to those in FIGS. 2A to 3F are denoted by the same reference numerals.

In accordance with the process of the second embodiment of the present invention, a third insulating layer 37 is additionally formed between the second insulating layer 36 and the first polysilicon layer 38, as shown in FIGS. 4A and 5A. The formation of the third insulating layer 37 is carried out after the formation of the second insulating layer 36. The first polysilicon layer 38 disposed over the third insulating layer 37 is electrically connected to the impurity-diffused regions 26 for sources via the third insulating layer 37, the second insulating layer 36 and the first insulating layer 32. The third insulating layer 37 is made of a material having a higher etch selectivity than that of the second insulating layer 36. The formation of the first polysilicon layer 38 is achieved after the formation of the second and third insulating layers 36 and 37 on the bit lines 34.

Thereafter, a first oxide film pattern 40A and a double plate-type storage electrode 54 are formed on the third insulating layer 37, as shown in FIGS. 4B and 5B. The first oxide film pattern 40A is interposed in the storage electrode 54 which is constituted by a lower electrode plate comprised of a first polysilicon layer pattern 38A, an upper electrode plate comprised of a second polysilicon layer pattern 42A and a third polysilicon layer pattern 50A, and a plurality of vertical columns 51 comprised of the third polysilicon layer pattern 50A and adapted to electrically connect the upper electrode plate to the lower electrode plate and maintain a predetermined space between the upper and lower electrode plates. The first, second and third polysilicon layer patterns 38A, 42A and 50A and the first oxide film pattern 40A are formed by use of the steps of the first embodiment shown in FIGS. 2B to 2D and FIGS. 3B to 3D, the steps of sequentially removing portions of the third polysilicon layer 50 exposed partially through the second photoresist pattern 52 and respective portions of the second polysilicon layer pattern 42A, the first oxide film pattern 40A and the first polysilicon layer 38 disposed beneath the exposed portions of the third polysilicon layer 50 by the use of an etch process, thereby forming the double plate-type storage electrode 54, and the step of removing the second photoresist pattern 52 after the formation of the storage electrode 54.

Thereafter, the third insulating layer 37 and the first oxide film pattern 40A are completely removed by the use of a wet etch process so as to expose the lower and upper surfaces of the first polysilicon layer pattern 38A, and the lower surface of the second polysilicon layer pattern 42A and the upper surface of the second insulating layer 37, as shown in FIG. 4B and 5B. Then a dielectric film 56 and a plate electrode 58 made of polysilicon are sequentially coated over the entire exposed surface of the resulting structure including the lower surface of the first polysilicon layer pattern 38A, the entire exposed surface of the double plate-type storage electrode 54 and the upper surface of the second insulating layer 37, as shown in FIGS. 4C and 5C. The double plate-type storage electrode 54 shown in FIGS. 4C and 5C has a larger surface area than that shown in FIGS. 2F and 3F, by the surface area of the lower surface of the lower electrode.

FIGS. 6A to 6C are sectional views respectively taken along the line A—A' of FIG. 1. On the other hand, FIGS. 7A to 7C are sectional views respectively taken along the line B—B' of FIG. 1. FIGS. 6A to 6C and FIGS. 7A to 7C illustrate respectively the sequential steps of a process for fabricating a stack capacitor in accordance with a third embodiment of the present invention. In FIGS. 6A to 7C, elements corresponding to those in FIGS. 2A to 3F are denoted by the same reference numerals.

FIGS. 6A and 7A show a silicon substrate 22 including a first oxide film pattern 40A and a second polysilicon layer pattern 42A formed on the first polysilicon layer 38 shown in FIGS. 2A and 3A. The first oxide film pattern 40A and the second polysilicon layer pattern 42A are formed by the use of the steps of the first embodiment shown in FIGS. 2A to 2C and FIGS. 3A to 3C, the step of selectively etching portions of the second polysilicon layer 42 exposed through the second oxide film pattern 44A and the side wall oxide films 48 shown in FIGS. 2C and 3C, thereby partially exposing the first oxide film pattern 40, and the step of sequentially removing the portions of the first oxide film 40, the second oxide film pattern 44A and the side wall oxide films 48. The first polysilicon layer 38 is partially exposed through the second polysilicon layer pattern 42A and the first oxide film pattern 40A.

After completion of the steps shown in FIGS. 6A and 7A, the second polysilicon layer pattern 42A is completely removed by the use of the etch process, thereby causing the first oxide film pattern 42A to be exposed. Upon etching the second polysilicon layer pattern 42A, the exposed portions of the first polysilicon layer 38 are also etched, thereby forming grooves, as shown in FIGS. 6B and 7B. In order to prevent the grooves from reaching the surface of the second insulating layer 36, the second polysilicon layer pattern 42A has a sufficient thickness of at least 500 Å. A third polysilicon layer 50 is then deposited over the entire exposed surface of the resulting structure including the grooves formed in the surface of the first polysilicon layer 38 and the first oxide film pattern 40A. Over the third polysilicon layer 50, a second photoresist film pattern 52 to be used as a storage electrode mask is formed. The third polysilicon layer 50 is electrically connected to the first polysilicon layer 38 and spaced apart from the first polysilicon layer 38 by the thickness of the first oxide film pattern 40A.

Thereafter, a double plate-type storage electrode 54 is formed which is constituted by a lower electrode plate comprised of a first polysilicon layer pattern 38A, an upper electrode plate comprised of a third polysilicon layer pattern 50A, and a plurality of vertical columns 55 comprised of the third polysilicon layer pattern 50A and adapted to electrically connect the upper electrode plate to the lower electrode plate and maintain a predetermined space between the upper and lower electrode plates. The third polysilicon layer pattern 50A and the first polysilicon layer pattern 38A are formed by sequentially removing portions of the third polysilicon layer 50 exposed through the second photoresist pattern 52 and respective portions of the first oxide film pattern 40A and the first polysilicon layer 38 disposed beneath the exposed portions of the third polysilicon layer 50 with dye etching. After the formation of the first and third polysilicon layer patterns 38A and 50A, the second photoresist pattern 52 is removed, and also the first oxide film pattern 40A disposed between the first and third polysilicon layer patterns 38A and 50A is completely removed by the use of the wet etch process. As a result, the upper surface of the first polysilicon layer pattern 38A and the lower surface of the third polysilicon layer pattern 50A are exposed. Thereafter, a dielectric film 56 and a plate electrode 58 made of polysilicon are sequentially coated over the entire exposed surface of the double plate-type storage electrode 54 (that is, the side wall surfaces and upper surface of the first polysilicon layer pattern 38A and the side wall surfaces, upper surface and lower surface of the first polysilicon layer pattern 38A.

FIGS. 8A to 8E are sectional views respectively taken along the line A–A' of FIG. 1. On the other hand, FIGS. 9A to 9E are sectional views respectively taken along the line B–B' of FIG. 1. FIGS. 8A to 8E and FIGS. 9A to 9E illustrate respectively the sequential steps of a process for fabricating a stack capacitor in accordance with a fourth embodiment of the present invention. In accordance with this process, a stack capacitor including a triple plate-type storage electrode is fabricated. This stack capacitor can have larger capacitance than that of the stack capacitor including the double plate-type storage electrode in accordance with the above-mentioned processes. In FIGS. 8A to 9E, elements corresponding to those in FIGS. 2A to 3F are denoted by the same reference numerals.

In accordance with this embodiment, a silicon substrate 22 is first prepared which includes a first polysilicon layer 38 formed thereon in the same manner as shown in FIGS. 2A and 3A. Sequentially formed over the first polysilicon layer 38 impurity-diffused regions 26 are a first oxide film 40, a second polysilicon layer 42, a second oxide film 44, a third polysilicon layer 60, and a third oxide film 62, as shown in FIG. 8A and 9A. A first photoresist film 46 is then formed over the third oxide film 62. The third polysilicon layer 60 has a thickness larger than that of the second polysilicon layer 42 by at least 500 Å so as not to be removed upon patterning the second polysilicon layer 42.

Thereafter, portions of the third oxide film 62 exposed through the first photoresist pattern 46 are dry-etched, thereby forming a third oxide film pattern 62A. After the formation of the third oxide film pattern 62A, the first photoresist pattern 46 is removed. Subsequently, spacers 48 made of an oxide are formed at side walls of the third oxide film pattern 62A. Neighboring spacers 48 are spaced a distance of about 1,000 Å from each other.

After completion of the steps shown in FIGS. 8B and 9B, portions of the third polysilicon layer 60 exposed through the third oxide film pattern 62A and the spacers 63 are etched, thereby forming a third polysilicon layer pattern 60A through which the second oxide film 44 is partially exposed. The exposed portions of the second oxide film 44 is then etched to form a second oxide film pattern 44A. Upon etching the exposed portions of the second oxide film 44, the spacers 63 and the third oxide film pattern 62A are completely removed. Thereafter, portions of the second polysilicon layer 42 exposed through the second oxide film pattern 44A are etched such that the first oxide film 40 is partially exposed, thereby forming a second polysilicon layer pattern 42A. Upon patterning the second polysilicon layer 42, the third polysilicon layer pattern 60A is also etched. However, the third polysilicon layer pattern 60A remains to have a thickness of at least 500 Å. Subsequently, portions of the first oxide film 40 exposed through the second polysilicon layer pattern 42A is etched such that the first polysilicon layer 38 is partially exposed, thereby forming a first oxide film pattern 40A. As a result, the first polysilicon layer 38 is partially exposed through the third polysilicon layer pattern 60A. Over the entire exposed surface of the resulting structure including the third polysilicon layer pattern 60 and the exposed portions of the first polysilicon layer 38, a fourth polysilicon layer 64 is deposited, as shown in FIG. 8C and 9C. Over the fourth polysilicon layer 64, a second photoresist pattern 52 is formed which is to be used as a mask for word lines.

Figures 8D, 9D:
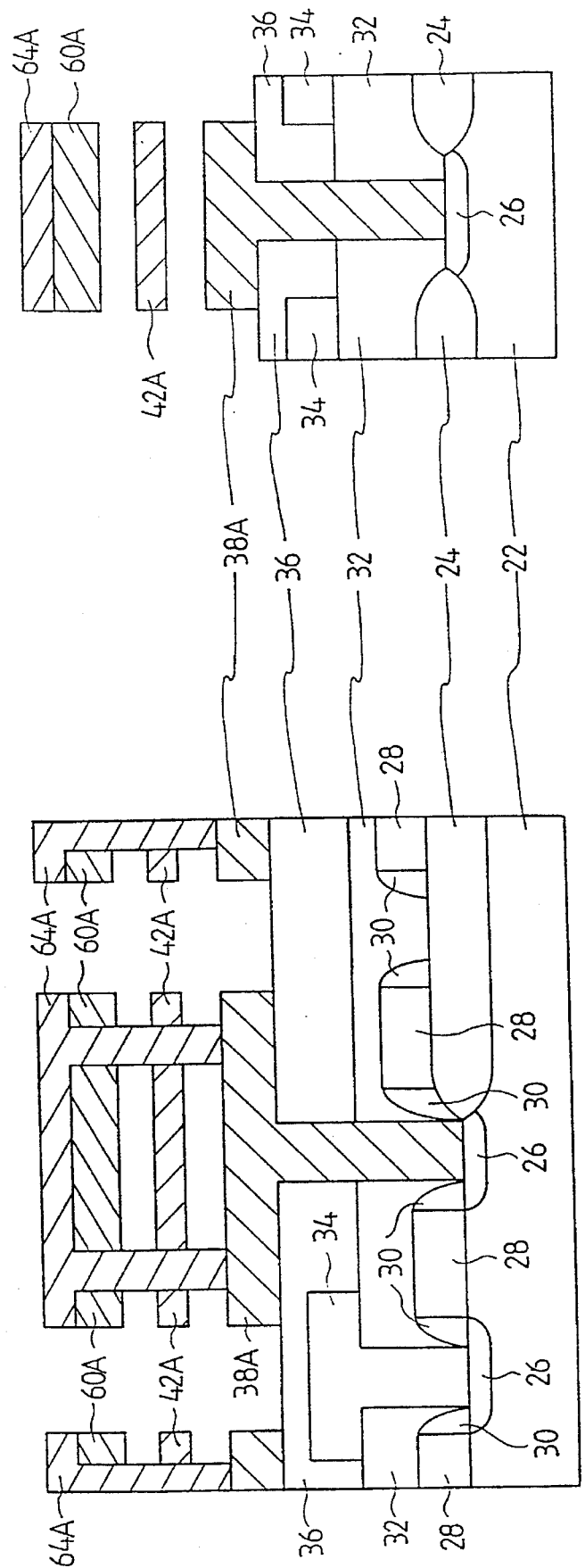

Then a triple plate-type storage electrode 66 is formed on the second insulating layer 36, as shown in FIGS. 8D and 9D. The triple plate-type electrode 66 includes a lower electrode plate comprised of the first polysilicon layer pattern 38A, an upper electrode plate comprised of the third and fourth polysilicon layer patterns 60A and 64A, an intermediate electrode plate comprised of the second polysilicon layer pattern 42A, and a plurality of vertical columns 65 comprised of the fourth polysilicon layer pattern 64A and adapted to electrically connect the upper electrode plate, the intermediate electrode plate and the lower electrode plate to one another and maintain a predetermined space among the upper, intermediate and lower electrode plates. The upper, intermediate and lower electrode plates are formed by sequentially dry etching portions of the fourth polysilicon layer 64 exposed through the second photoresist pattern 52, and respective portions of the third polysilicon layer pattern 60A, the second oxide film pattern 44A, the second polysilicon layer pattern 42A, the first oxide film pattern 40A and the first polysilicon layer 38. After the formation of the triple plate-type storage electrode 66, the second photoresist pattern 52 is removed. After the formation of the triple plate-type storage electrode 66, the first oxide film pattern 40A remains between the first polysilicon layer pattern 38A and the second polysilicon layer pattern 42A while the second oxide film pattern 44A remains between the second polysilicon layer pattern 42A and the third polysilicon layer pattern 60A. Then the remaining first and second oxide film patterns 40A and 44A are completely removed by the use of the wet etch process, thereby exposing the upper surface of the first polysilicon layer pattern 38A, the lower surface of the second polysilicon layer pattern 42A, the upper surface of the second polysilicon layer pattern 42A and the lower surface of the third polysilicon layer pattern 60A.

Figures 8E, 9E:
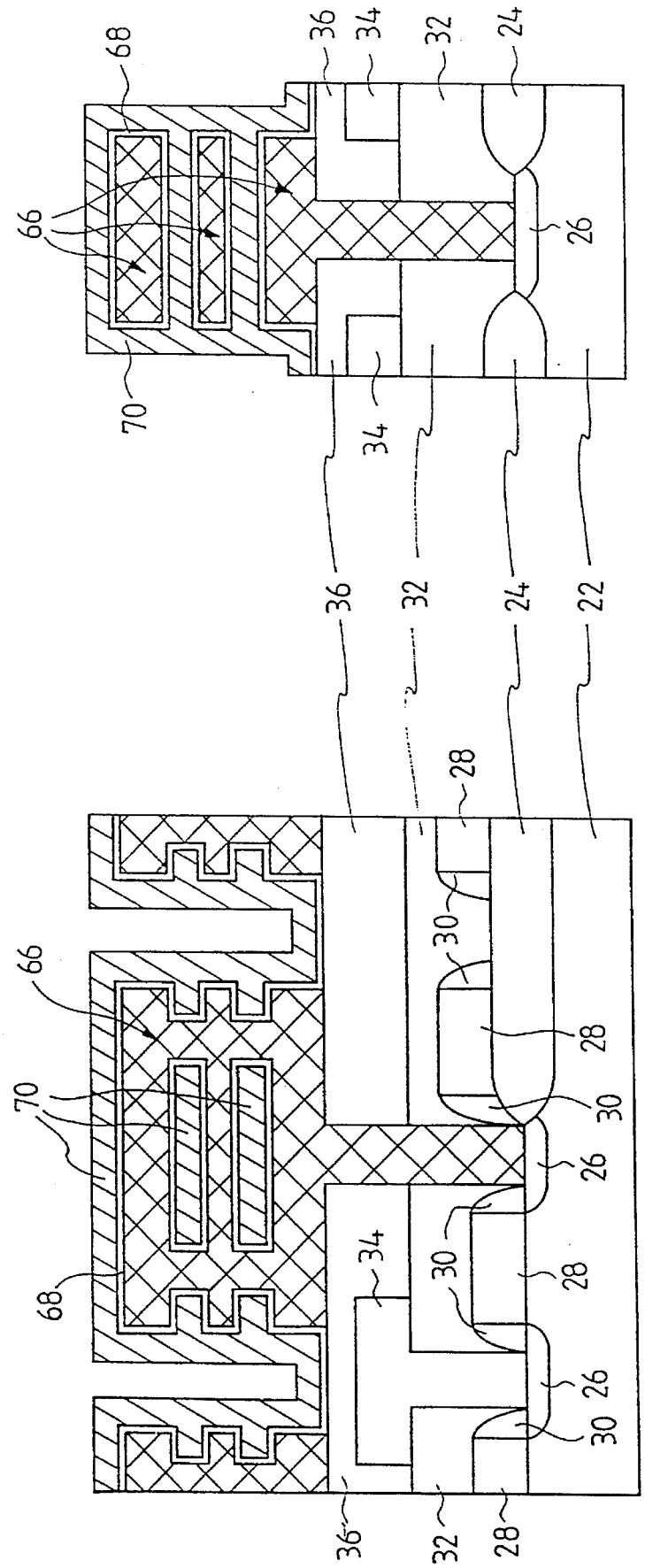

A dielectric film 68 is then formed over the entire exposed surface of the resulting structure including the upper surface and side surfaces of the fourth polysilicon layer pattern 64A, the lower surface of the third polysilicon layer pattern 60A, the side surfaces, upper surface and lower surfaces of the second polysilicon layer pattern 42A, and the side surfaces and upper surface of the first polysilicon layer pattern 38A, as shown in FIGS. 8E and 9E. Subsequently, a plate electrode 70 made of polysilicon is formed over the dielectric film 68.

As apparent from the above description, the present invention provides a stack capacitor with a storage electrode structure including at least electrode plates electrically connected with metal oxide semiconductor (MOS) transistors and a process for fabricating the same. With such a storage electrode structure, the present invention provides an advantage of enhanced capacitance obtained in a limited capacitor area. By virtue of such an advantage, it is possible to reduce the unit occupied area of memory cell and, thus, to improve the integration degree of a semiconductor memory device finally produced.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed:

1. A process for fabricating a stacked capacitor of a dynamic random access memory (DRAM) device, the process comprising:

forming a metal oxide semiconductor field effect transistor (MOSFET) on a silicon substrate, coating an insulating film for planarization over an entire exposed surface of a resulting structure including the MOSFET, and forming a first polysilicon layer connected to a source and a drain of the MOSFET;

sequentially forming a first oxide film, a second polysilicon layer and a second oxide film over said first polysilicon layer, and then forming a first photoresist pattern on said second oxide film;

etching exposed portions of the second oxide film to form a second oxide film pattern, removing said first photoresist pattern, and then forming side wall oxide films on respective side walls of said second oxide film pattern and exposing portions of said second polysilicon layer;

etching through said exposed portions of said second polysilicon layer, and etching exposed portions of said first oxide film, and removing said second oxide film pattern and said side wall oxide films, thereby partially exposing the first polysilicon layer;

depositing a third polysilicon layer over an entire exposed surface of a resulting structure such that it is connected with the partially exposed first polysilicon layer, and forming a second photoresist pattern for a storage electrode;

sequentially dry etching said third polysilicon layer, said second polysilicon layer, said first oxide film and said first polysilicon layer under a condition that the second photoresist pattern is used as a mask, removing the second photoresist pattern, and wet-etching the remaining first oxide film; and forming a capacitor dielectric film and a plate electrode on an inner surface and an outer surface of said storage electrode including the first, second and third polysilicon layers.

2. A process in accordance with claim 1, wherein:

said first oxide film has a thickness of 1,000 to 2,500 Å and said second oxide film has a thickness of 1,000 to 3,000 Å.

3. A process in accordance with claim 1, wherein:

said first photoresist pattern is formed using a mask having a polarity opposite to that of a mask for forming word lines.

4. A process in accordance with claim 2, wherein:

neighboring side wall oxide films have a space of about 1,000 Å.

5. A process in accordance with claim 1, further comprising:

forming an insulating layer over said planarization insulating film, said insulating layer being etched by an etchant during said wet-etching of said first oxide film such that said first polysilicon layer is exposed at a lower surface thereof.

6. A process for fabricating a stacked capacitor of a dynamic random access memory device, comprising:

forming a metal oxide semiconductor field effect transistor (MOSFET) on a silicon substrate, coating an insulating film for planarization over an entire exposed surface of a resulting structure including the MOSFET, and forming a first polysilicon layer connected to the MOSFET;

sequentially forming a first oxide film, a second polysilicon layer and a second oxide film over said first polysilicon layer, and then forming a first photoresist pattern on said second oxide film;

etching portions of the second oxide film exposed through said first photoresist pattern to form a second oxide film pattern, removing said first photoresist pattern, and then forming side wall oxide films on respective side walls of said second oxide film pattern;

etching through portions of said second polysilicon layer exposed through said second oxide film pattern and said side walls, and etching exposed portions of said first oxide film, and removing said second oxide film pattern and said side wall oxide films, thereby partially exposing the first polysilicon layer, and then etching the remaining second polysilicon layer to be completely removed;

depositing a third polysilicon layer over an entire exposed surface of a resulting structure such that it is connected with the first polysilicon layer, and forming a second photoresist pattern for a storage electrode;

sequentially dry-etching said third polysilicon layer, said first oxide film and said first polysilicon layer under a condition that the second photoresist pattern is used as a mask, removing the second photoresist pattern, and wet-etching the remaining first oxide film; and forming a capacitor dielectric film and a plate electrode on an inner surface and an outer surface of said storage electrode including the first and third polysilicon layers.

7. A process in accordance with claim 6, wherein:

said first polysilicon layer has a thickness larger than that of said second polysilicon layer by 500 Å.

8. A process for fabricating a stacked capacitor of a dynamic random access memory device, comprising the steps of:

forming a metal oxide semiconductor field effect transistor on a silicon substrate, coating an insulating film for planarization over an entire exposed surface of the resulting structure including said transistor and forming a first polysilicon layer connected to the transistor;

sequentially forming a first oxide film, a second polysilicon layer, a second oxide film, a third polysilicon layer and a third oxide film over said first polysilicon layer and then forming a first photoresist pattern on said third oxide film;

etching portions of the third oxide film exposed through said first photoresist pattern to form a third oxide film pattern, removing said first photoresist pattern, and then forming side wall oxide films respectively on side walls of said third oxide film pattern;

etching portions of said third polysilicon layer through the third oxide film pattern and the side wall oxide films to partially expose the second oxide film, and etching exposed portions of said second oxide film, said third oxide film pattern and said side wall oxide films under a condition that said third polysilicon layer is used as a mask, thereby partially exposing the second polysilicon layer;

dry-etching said partially exposed portions of the second polysilicon layer under a condition that the third polysilicon layer is used as a mask until the first oxide film is exposed, and etching exposed portions of the first oxide film under a condition that the third polysilicon layer is used as a mask, thereby partially exposing the first polysilicon layer;

depositing a fourth polysilicon layer over an entire exposed surface of a resulting structure such that it is electrically connected with the partially exposed first polysilicon layer, and forming a second photoresist pattern for a storage electrode over said fourth polysilicon layer;

sequentially dry-etching said fourth polysilicon layer, said third polysilicon layer, said second oxide film, said second polysilicon layer, said first oxide film and said first polysilicon layer under a condition that the second photoresist pattern is used as a mask, removing the second photoresist pattern, and wet-etching the remaining second oxide film and the remaining first oxide film; and forming a capacitor dielectric film and a plate electrode on inner and outer surfaces of a storage electrode constituted by the first, second, third and fourth polysilicon layers.

* * * * *